United States Patent
Gandhi et al.

(10) Patent No.: US 10,481,200 B2
(45) Date of Patent: Nov. 19, 2019

(54) SEMICONDUCTOR DEVICE TEST APPARATUSES COMPRISING AT LEAST ONE TEST SITE HAVING AN ARRAY OF POCKETS

(71) Applicant: Micron Technology, Inc., Boise, ID (US)

(72) Inventors: Jaspreet S. Gandhi, Boise, ID (US); Michel Koopmans, Boise, ID (US); James M. Derderian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/177,917

(22) Filed: Nov. 1, 2018

(65) Prior Publication Data

US 2019/0072608 A1    Mar. 7, 2019

Related U.S. Application Data (60) Continuation of application No. 15/660,387, filed on Jul. 26, 2017, now Pat. No. 10,126,357, which is a division of application No. 14/495,025, filed on Sep. 24, 2014, now Pat. No. 9,733,304.

(51) Int. Cl.
*G01R 31/00* (2006.01)
*G01R 31/28* (2006.01)
*G01R 1/073* (2006.01)

(52) U.S. Cl.
CPC ..... *G01R 31/2887* (2013.01); *G01R 1/07307* (2013.01); *G01R 31/2884* (2013.01)

(58) Field of Classification Search
USPC ............................................. 324/756, 756.03
See application file for complete search history.

(56) References Cited

U.S. PATENT DOCUMENTS

| | | | | |
|---|---|---|---|---|
| 5,500,605 A | * | 3/1996 | Chang | G01R 1/06711 324/754.14 |
| 5,702,255 A | * | 12/1997 | Murphy | H01R 13/2478 439/71 |
| 5,813,870 A | * | 9/1998 | Gaynes | H01L 21/6835 439/91 |
| 6,062,873 A | * | 5/2000 | Kato | G01R 1/0408 439/66 |
| 6,069,482 A | * | 5/2000 | Hilton | G01R 1/0483 324/755.08 |
| 6,181,149 B1 | * | 1/2001 | Godfrey | G01R 1/0408 324/750.19 |

(Continued)

*Primary Examiner* — Caleb E Henry
(74) *Attorney, Agent, or Firm* — TraskBritt (57) ABSTRACT

Apparatus for testing semiconductor devices comprising die stacks, the apparatus comprising a substrate having an array of pockets in a surface thereof arranged to correspond to conductive elements protruding from a semiconductor device to be tested. The pockets include conductive contacts with traces extending to conductive pads, which may be configured as test pads, jumper pads, edge connects or contact pads. The substrate may comprise a semiconductor wafer or wafer segment and, if the latter, multiple segments may be received in recesses in a fixture. Testing may be effected using a probe card, a bond head carrying conductive pins, or through conductors carried by the fixture.

18 Claims, 6 Drawing Sheets

(56) References Cited

U.S. PATENT DOCUMENTS

| | | | | |
|---|---|---|---|---|
| 6,188,230 B1* | 2/2001 | Birk | G01R 1/0416 | 324/756.05 |
| 6,204,680 B1* | 3/2001 | Swart | G01R 1/0483 | 324/754.08 |
| 6,373,273 B2* | 4/2002 | Akram | G01R 1/0483 | 257/730 |
| 6,392,887 B1* | 5/2002 | Day | H01L 23/32 | 165/80.2 |
| 6,426,642 B1* | 7/2002 | Akram | G01R 1/0483 | 257/730 |
| 6,462,572 B2* | 10/2002 | Takahashi | G01R 1/0483 | 324/754.08 |
| 6,486,690 B1* | 11/2002 | Takagi | G01R 1/07371 | 324/756.07 |
| 6,503,089 B2* | 1/2003 | Saijo | G01R 1/045 | 439/70 |
| 6,541,991 B1* | 4/2003 | Hornchek | G01R 1/0483 | 324/754.07 |
| 6,563,330 B1* | 5/2003 | Maruyama | G01R 31/2886 | 324/754.14 |
| 6,624,645 B2* | 9/2003 | Haseyama | G01R 1/06716 | 324/750.25 |
| 6,628,128 B1* | 9/2003 | Farnworth | G01R 1/0483 | 324/756.02 |
| 6,636,057 B1* | 10/2003 | Uchikura | G01R 1/07371 | 324/756.05 |
| 6,695,623 B2* | 2/2004 | Brodsky | H05K 3/325 | 29/842 |
| 6,798,228 B2* | 9/2004 | Cuevas | G01R 1/0433 | 324/750.24 |
| 6,819,127 B1* | 11/2004 | Hembree | G01R 1/0483 | 324/750.25 |
| 6,902,410 B2* | 6/2005 | Watanabe | G01R 1/045 | 439/66 |
| 6,998,864 B2* | 2/2006 | Karavakis | G01R 1/0483 | 324/754.18 |
| 7,088,118 B2* | 8/2006 | Liu | G01R 31/2889 | 324/756.03 |
| 7,109,732 B2* | 9/2006 | Alcoe | G01R 1/0483 | 324/750.25 |
| 7,199,599 B2* | 4/2007 | Batara | G01R 1/0433 | 324/750.08 |
| 7,202,679 B2* | 4/2007 | Maruyama | G01R 1/06711 | 324/754.16 |
| 7,220,989 B2* | 5/2007 | Chuan | G01R 1/0483 | 257/48 |
| 7,309,996 B2* | 12/2007 | Tashiro | G01R 1/0483 | 324/754.13 |
| 7,368,927 B2* | 5/2008 | Smith | G01R 1/0735 | 324/754.07 |
| 7,514,946 B2* | 4/2009 | Soeta | G01R 31/2865 | 324/750.09 |
| 7,579,826 B2* | 8/2009 | Lee | G01R 1/0466 | 324/756.02 |
| 7,601,018 B2* | 10/2009 | Hwang | G01R 1/0483 | 439/331 |
| 7,602,201 B2* | 10/2009 | Ysaguirre | G01R 1/0433 | 324/756.02 |
| 7,667,473 B1* | 2/2010 | Conn | H01L 21/563 | 324/750.3 |
| 7,837,481 B1* | 11/2010 | Mahoney | H01R 12/7076 | 439/66 |
| 7,956,632 B2* | 6/2011 | Takatori | G01R 1/0483 | 324/756.02 |
| 8,008,661 B2* | 8/2011 | Lee | G01R 1/0466 | 257/48 |
| 8,269,516 B1* | 9/2012 | Mardi | G01R 1/06722 | 324/754.08 |
| 8,410,806 B2* | 4/2013 | Smith | G01R 1/06711 | 324/755.01 |
| 8,491,315 B1* | 7/2013 | Ramsey | H01R 12/714 | 439/66 |
| 8,939,784 B2* | 1/2015 | Lee | H01R 23/70 | 439/314 |
| 8,975,909 B1* | 3/2015 | Cortez | G01R 1/06722 | 324/754.01 |
| 8,988,095 B2* | 3/2015 | Nakamura | G01R 1/0433 | 324/756.02 |
| 9,049,789 B2* | 6/2015 | Ohsawa | H05K 1/0296 | |
| 9,261,537 B2* | 2/2016 | Edwards | G01R 1/07307 | |
| 9,274,166 B2* | 3/2016 | Rackley | G01R 31/2887 | |
| 2003/0076123 A1* | 4/2003 | Ikeya | G01R 1/0483 | 324/756.02 |
| 2004/0140821 A1* | 7/2004 | Lee | G01R 1/07314 | 324/754.14 |
| 2005/0280428 A1* | 12/2005 | Ishikawa | G01R 1/06722 | 324/750.16 |
| 2006/0181298 A1* | 8/2006 | Farnworth | G01R 31/2886 | 324/750.03 |
| 2008/0238462 A1* | 10/2008 | Hartmann | G01R 31/2891 | 324/762.01 |
| 2009/0085593 A1* | 4/2009 | Yoshida | G01R 1/06772 | 324/754.1 |
| 2009/0201038 A1* | 8/2009 | Knickerbocker | G01R 1/07314 | 324/762.05 |
| 2014/0028341 A1* | 1/2014 | Mikuni | G01R 1/07307 | 324/756.03 |
| 2014/0145742 A1* | 5/2014 | Sugai | G01R 1/07378 | 324/756.03 |
| 2014/0191775 A1* | 7/2014 | Beaman | G01R 1/0675 | 324/755.02 |
| 2015/0185281 A1* | 7/2015 | Diglio | G01R 1/0466 | 324/750.24 |
| 2015/0226794 A1* | 8/2015 | Chen | G01R 1/0433 | 324/756.02 |
| 2015/0276859 A1* | 10/2015 | Aizawa | G01R 1/0433 | 324/756.01 |
| 2016/0084905 A1 | 3/2016 | Gandhi et al. | | |

* cited by examiner

SEMICONDUCTOR DEVICE TEST APPARATUSES COMPRISING AT LEAST ONE TEST SITE HAVING AN ARRAY OF POCKETS

CROSS-REFERENCE TO RELATED APPLICATIONS

This application is a continuation of U.S. patent application Ser. No. 15/660,387, filed Jul. 26, 2017, now U.S. Pat. No. 10,126,357, issued Oct. 24, 2018, which is a divisional of U.S. patent application Ser. No. 14/495,025, filed Sep. 24, 2014, now U.S. Pat. No. 9,733,304, issued Aug. 15, 2017, the disclosure of each of which is hereby incorporated herein in its entirety by this reference.

TECHNICAL FIELD

Embodiments disclosed herein relate generally to apparatus and methods for testing stacked die assemblies. More specifically, embodiments of the disclosure relate to apparatus and methods for testing wide I/O and high bandwidth memory packages.

BACKGROUND

Standards setting organization for the semiconductor electronics industry, such as the JEDEC Solid State Technology Association (formerly the Joint Electron Device Engineering Council and hereinafter referred to as "JEDEC" for convenience), have established standards, such as test methods and product standards, including package standards and interface standards, that are widely employed in the industry.

Figure 1:
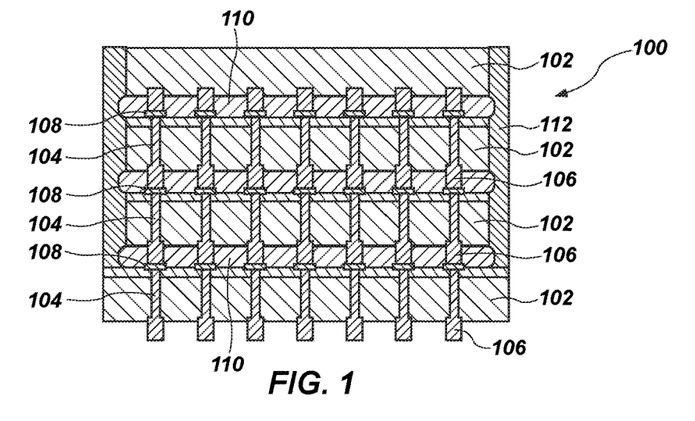
FIG. 1 is a schematic cross-sectional view of a stacked DRAM cube.

Among other standards, JEDEC has standardized package dimensions (length×width×height) for Wide I/O and high bandwidth memory (HBM) technologies. The package construction comprises an encapsulated three-dimensional stack of DRAM semiconductor dice (for example, four, eight, twelve or sixteen dice) having conductive vias in the form of so-called "through silicon vias," or "TSVs," interconnected using a three-dimensional interconnect architecture using electrically conductive elements in communication with the TSVs extending between adjacent dice and having electrically conductive pillars protruding from a base semiconductor die of the stack to connect to higher level packaging such as a printed circuit board. FIG. 1 schematically depicts a die stack 100 of four DRAM semiconductor dice 102, which structure may also be characterized as a "cube" herein for the sake of convenience. Semiconductor dice 102 of a die stack 100 may include TSVs 104, conductive elements 106 in the form of pillars in contact with TSVs 104 (with the exception of top semiconductor die 102) extending between adjacent semiconductor dice 102 to landing pads 108 of adjacent semiconductor dice 102. A dielectric underfill material 110, and a molded encapsulant 112 surround the three upper semiconductor dice 102 in the die stack 100 and abut a major surface of the lowermost semiconductor die 102. Conductive elements 106 in the form of pillars protrude from the lowermost semiconductor die 102 for connection to, for example, a logic die or to higher level packaging.

One specific implementation of the stacked die technology, described in the Hybrid Memory Cube Consortium's HMC Specifications 1.0 and 1.1, is the so-called Hybrid Memory Cube (HMC), which places a logic die under a stack of four or eight TSV-bonded DRAM semiconductor dice to form a package ready for connection to, for example, a motherboard bearing a microprocessor, without the need for a separate organic or silicon interposer. With such an approach, memory density and speed may be significantly increased while simultaneously dramatically decreasing power requirements.

While there are several known processes for fabricating assemblies and packaging as described above, a significant challenge to widespread adoption of this technology is testing throughput. In other words, manufacturers must have the capability of shipping massive quantities of "known good cubes" to customers.

To date, the ability to test stacked die assemblies in the form of cubes to qualify them as "known good cubes" has been limited to laborious, single cube testing. There is a need for an automated solution for simultaneous testing of a number of stacked die assemblies.

DETAILED DESCRIPTION

The illustrations included herewith are not meant to be actual views of any particular systems or semiconductor structures, but are merely idealized representations that are employed to describe embodiments described herein. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing semiconductor structures or semiconductor die assemblies, and the semiconductor structures and die assemblies described below do not form a complete semiconductor device or die assembly. Only those process acts and structures necessary to understand the embodiments described herein are described in detail below. Additional acts to form a complete semiconductor device or a complete die assembly including the semiconductor structures may be performed by conventional techniques.

Figure 2A:
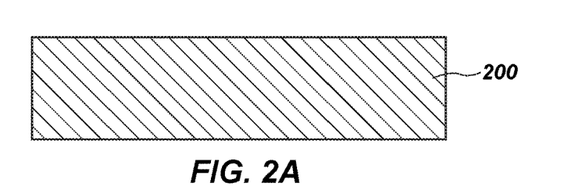
FIGS. 2A through 2D schematically illustrate acts in a process flow to fabricate a test structure according to an embodiment of the disclosure for testing multiple cubes.
Figure 2B:
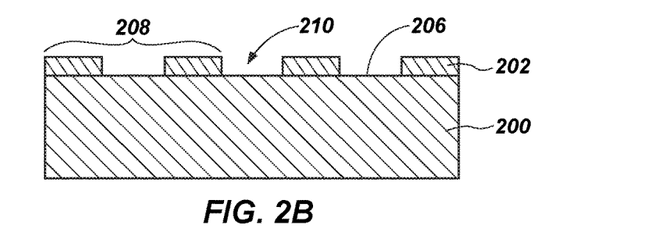
Figure 2C:
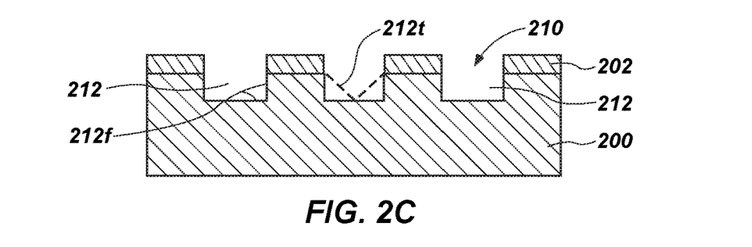
Figure 2D:
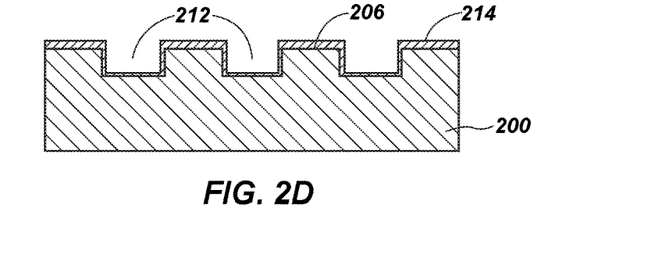

In one embodiment, with reference to FIGS. 2A through 2D of the drawings, a semiconductor wafer 200 may be employed in the fabrication of a test platform, which may also be characterized as a test structure. Test structures may be employed for electrical testing and characterization of die stacks 100, for example, verification of interconnect integrity within a die stack 100, signal speed within a die stack 100 and externally, $V_{oh}$, $V_{ol}$, $t_d$, output slew rate, $V_{ih}$, $V_{il}$, input slew rate, $t_{su-}$, $t_{h-}$, leakage, continuity, fuse ID read, etc. Tests may be conducted at ambient temperature or at an elevated temperature, for example, in a burn-in oven. Referring to FIG. 2A, semiconductor wafer 200 may comprise a pristine wafer, or a reclaimed wafer damaged in processing to fabricate semiconductor dice, or otherwise defective. Semiconductor wafer 200 may, for example, comprise a relatively robust, full thickness wafer of about 775 µm thickness. As shown in FIG. 2B, a conventional resist coat 202 on wafer surface 206 may be photolithographically patterned as shown at 208 to create an array of apertures 210 in the resist coat 202 of a number and at a pitch corresponding to conductive pillars 106 of a cube to be tested. As shown in FIG. 2C, a wet or dry etch process may be conducted through portions of semiconductor wafer 200 exposed through apertures 210 in resist coat 202 to form an array of pockets 212 below apertures 210 and according to the aperture pattern. Pockets 212 may extend a substantially common depth into wafer 200. As shown in FIG. 2C, the pockets 212 may be formed using an anisotropic etch and comprise flat-bottomed pockets 212f with substantially vertical walls, or may be formed using an isotropic etch and comprise pockets of substantially conical or frustoconical shape and triangular cross-section having inclined walls as shown in broken lines at 212t. Subsequent to pocket formation and as shown in FIG. 2D, a dielectric material (not shown), for example, a silicon oxide, a silicon nitride, a polymer, or other readily formed or deposited material, may optionally be formed over wafer 200 and surfaces of pockets 212. A redistribution layer (RDL) is then formed by plating a conductive material 214, for example, copper or aluminum, over the dielectric material wafer surface 206 and into pockets 212, followed by application of another resist coat and photolithographic patterning, then etching, to form conductive traces 216 extending from conductive contacts 218 lining pockets 212 to test pads 220 laterally offset from pockets 212 of an associated test site, traces 216 and test pads 220 being shown in FIG. 3A and traces 216 and conductive contacts 218 being shown in FIG. 3B. It will be appreciated that materials other than a semiconductor wafer or other bulk semiconductor substrate, such as a ceramic, a glass, or other material susceptible to formation of pockets 212 and a redistribution layer comprising traces 216 extending from contacts 218 to test pads 220, may be employed in lieu of a semiconductor wafer or other bulk substrate of semiconductor material.

A semiconductor device test apparatus comprises at least one substrate comprising a number of mutually laterally spaced test sites, each test site including an array of pockets configured for at least partially receiving conductive elements protruding from a semiconductor device to be tested, and a conductive contact within each pocket coupled to a conductive trace extending to a conductive pad offset from the array of pockets.

Figure 3A:
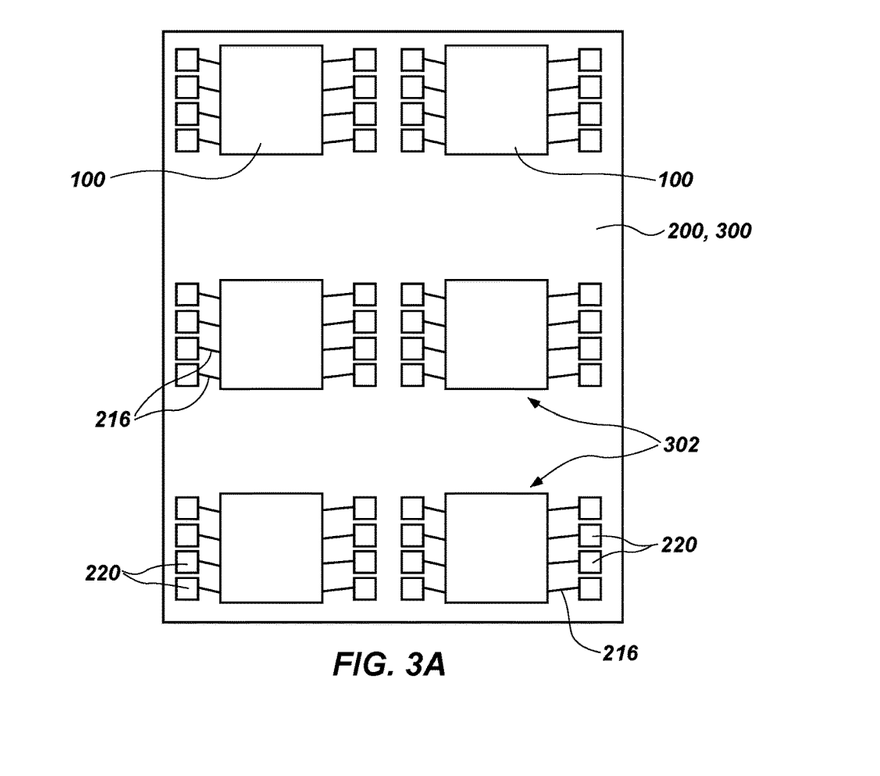
FIG. 3A is a schematic top elevation of a portion of a wafer-based test structure formed according to the process flow of FIGS. 2A-2D.
Figure 3B:
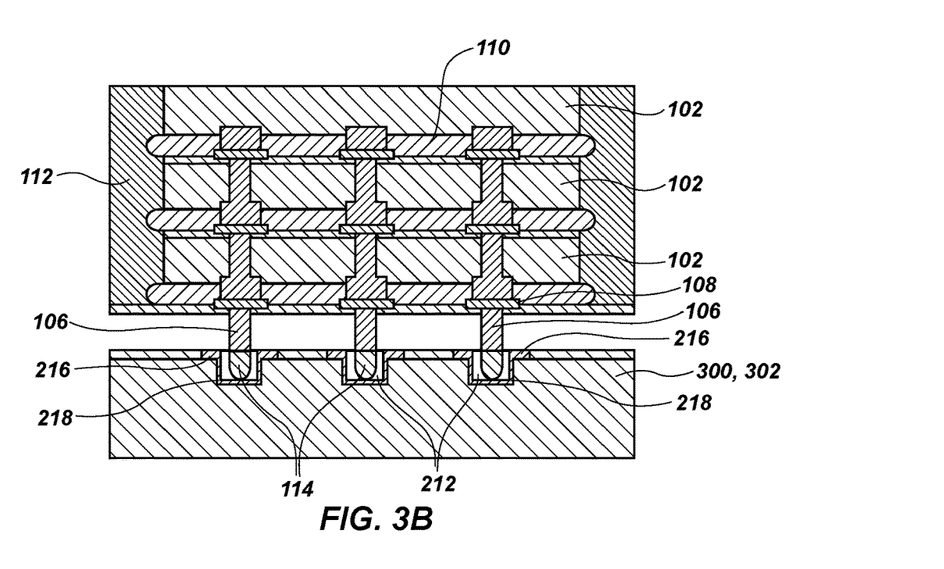
FIG. 3B is an enlarged schematic side elevation of a single cube mounted for testing on the wafer-based test structure.

FIG. 3A schematically depicts a portion of wafer 200 post-fabrication after the process flow of FIGS. 2A through 2D, resulting in test structure 300. Test structure 300 comprises multiple test sites 302, for example, sixty-four test sites, each test site 302 comprising a large number of pockets 212 (FIG. 3B) which, for testing a die stack 100 of DRAM semiconductor dice, may comprise, for example, an array of 1700 pockets 212 arranged and at a pitch, for example, of about 40 µm to correspond to the number of conductive elements 106 in the form of pillars protruding from a base die of a die stack 100 of a cube. The pillars, for example, may be of about 20 µm diameter, leaving about a 20 µm space between adjacent pillars. Pockets 212 may, for example, be of about 30 µm width, leaving about 10 µm between pockets 212, and a sufficient distance to enable fabrication by using conventional techniques of the conductive traces 216 and test pads 220 extending in a redistribution layer from conductive contacts 218 in pockets 212. A conductive contact 218 in each pocket 212 (FIG. 3B) communicates through a conductive trace 216 to a test pad 220 associated with the test site 302 of the associated pocket or pockets 212. As is known in the art, multiple conductive contacts 218 may communicate with a single test pad 220. Test pads 220, being laterally offset from the location on which a die stack 100 is received, beyond a footprint of the die stack 100, and at a substantially larger pitch than pockets 212 and conductive contacts 218, facilitate testing of die stacks 100 using, for example, a probe card. As shown in FIG. 3A, each test site 302 may be populated with a die stack 100 (shown enlarged and with only three semiconductor dice 102 for clarity), conductive elements 106 in the form of pillars of the lowermost semiconductor die 102 of each of which are each received in a pocket 212 as shown in FIG. 3B and in contact with a conductive contact 218. As further shown in FIG. 3B, each conductive elements 106 in the form of pillars may be tipped with a solder material 114, such as a tin/silver solder. If this is the case, whether or not a flat-bottom pocket configuration or a triangular cross-section pocket configuration is employed, the solder material 114 may be deformed when die stack 100 is placed to ensure sufficient electrical communication of conductive elements 106 in the form of pillars, which may vary slightly in depth (for example, ±about 2 µm), with conductive contacts 218 and, so, with test pads 220 through conductive traces 216, for testing of die stack 100. Subsequent to testing, solder material 114 may then be reflowed into a former, arcuate shape.

As may be appreciated from FIGS. 3A and 3B, test structure 300 may be populated with a large number of die stacks 100, one die stack 100 per test site 302, using a pick and place apparatus as known to those of ordinary skill in the art. Subsequent to population of the test sites 302 of a test structure 300 in the form of a wafer and with reference to FIG. 3C, an automated probe card 310 having a compliant material 312 (for example, silicone, an elastomer, or an elastomeric foam material) on an undersurface 314 may be automatically disposed sequentially over each test site 302 of, for example, a row or column of test sites 302, using a drive mechanism operating pursuant to a programmed controller, as known to those of ordinary skill in the art. A machine vision system using sensors carried by probe card 310 may also be used, also as known in the art, for enhanced precision in placement of probe card 310. Compliant material 312 may be used to compensate for slight variations in different die stacks 100. Probe card 310 is initially lowered into position over a test site 302 to contact an upper surface of a die stack 100, and then further lowered a distance (for example, between about 5 µm and about 10 µm), to compress compliant material 312 and ensure good electrical communication between solder material 114 (if employed) or conductive elements 106 in the form of pillars with conductive contacts 218 of that test site 302. At the same time, cantilevered pins 316, which may be spring-biased "pogo" pins, of probe card 310 contact test pads 220 laterally offset from and adjacent to the test site 302, and a test of die stack 100 is conducted through conductive elements 106 in the form of pillars of die stack 100 connected to test pads 220 through conductive contacts 218 and conductive traces 216 using test equipment operably coupled to pins 316. After the test is completed, probe card 310 is then moved to a next adjacent test site 302 of the row or column of test sites 302.

A method of testing a semiconductor device comprising a die stack having conductive elements protruding therefrom, wherein the method comprises placing a die stack on a test site of a substrate with conductive elements protruding from the die stack at least partially received in an array of pockets of the test site, applying a downward force to the die stack using a probe card and contacting test pads of the test site connected to conductive contacts of the pockets and laterally offset from the die stack with conductive pins carried by the probe card and operably coupled to test equipment, and conducting a test of the die stack.

Figure 3C:
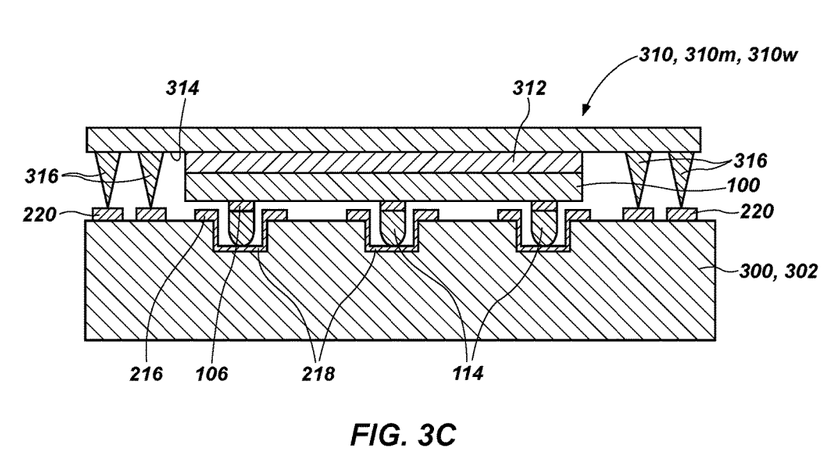
FIG. 3C is an enlarged schematic side elevation of a single cube under test on the wafer-based test structure.

While probe card 310 has been depicted as configured to test a single die stack 100, it is contemplated that a probe card may be configured to test multiple die stacks 100 on adjacent test sites 302. For example, a probe card 310m may be configured to contact and test die stacks 100 at two or four adjacent test sites 302, and a test equipment module may be operably coupled to each set of pins 316 for independently testing each die stack simultaneously. Alternatively, test equipment may be configured to selectively operably couple via a multiplexer to each set of pins 316 of a probe card 310m configured to test multiple die stacks 100 on adjacent test sites 302 to conduct tests of each die stack 100 one at a time before the probe card 310m is moved. As yet another alternative approach, a wafer-level probe card 310w may be deployed over an entire array of test sites 302 of a test structure 300, and each set of pins 316 for a test site 302 selectively coupled to test equipment as previously described.

Figure 4A:
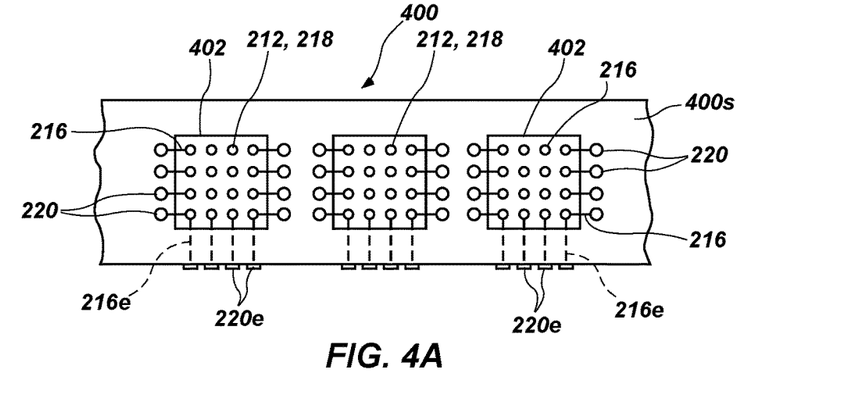
FIG. 4A is a schematic top elevation of another embodiment of the disclosure.

Referring to FIGS. 4A through 4D, another embodiment of a test structure 400 may comprise a strip of semiconductor material severed from a full thickness wafer or from another bulk robust semiconductor substrate. As with the foregoing embodiment, test structure 400 may employ pristine semiconductor material, or reclaimed or otherwise damaged semiconductor material. Each test structure 400 may bear a set of linearly spaced test sites 402 as shown in FIG. 4A, wherein a portion of a strip of semiconductor material 400s comprising test structure 400 is depicted with a few test sites 402, for clarity. Each test site 402 comprises an array of pockets 212 (only a few shown for clarity) having conductive contacts 218 extending through traces 216 to laterally offset test pads 220. Sets of test structures 400 may be located as adjacent strips in a fixture 410, as shown schematically in FIG. 4C, to simulate a full wafer array of test sites such as those of test structure 300, while providing the ability to replace a subset of test sites 402 should one or more test sites 402 of a test structure 400 become worn, damaged or otherwise inoperable, with a new test structure 400. Thus, unlike test structure 300, where inoperability of a test site 302 reduces the test capability of test structure 300 and also results in pick and place and probe card issues in skipping inoperable test sites 302, if a test structure 400 fails, it may be replaced immediately and testing continued using a fully populated, operable set of test structures 400 in a fixture 410 without alteration of pick and place or probe card movement.

Figure 4B:
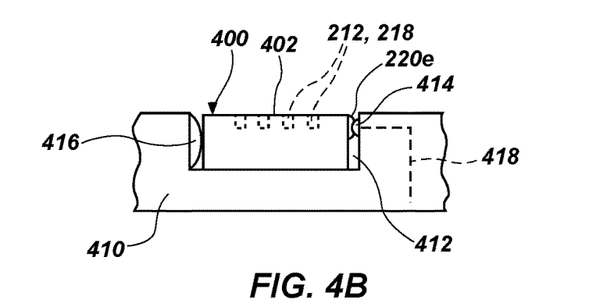
FIG. 4B is a schematic side, cross-sectional schematic view of an example electrical connection format for the embodiment, and FIG. 4C schematically depicts an arrangement of test structures of this embodiment, mounted in a fixture and optionally connected to test equipment through the fixture.
Figure 4C:
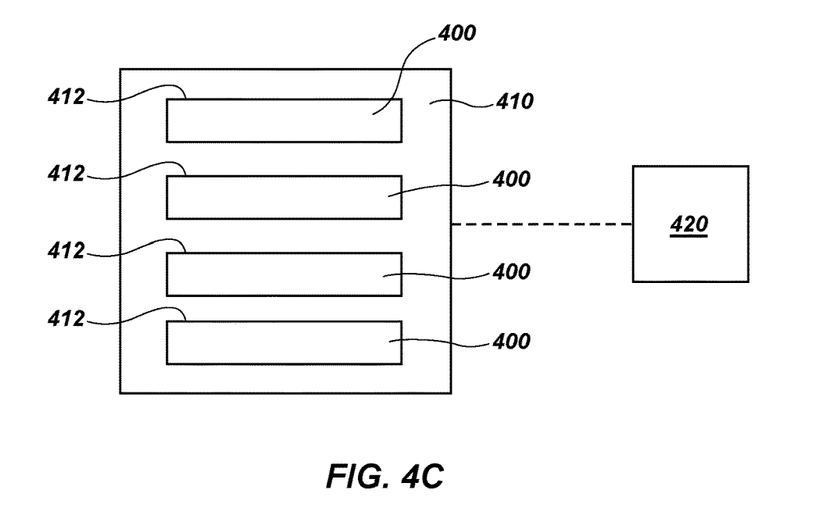

As further depicted in FIG. 4A, instead of being configured for use with a probe card, test structure 400 may be configured with a redistribution layer shown in broken lines in the form of conductive traces 216e leading from conductive contacts 218 to edge connect test pads 220e (enlarged for clarity), by which each set of conductive contacts 218 of a test site 402 may be connected through engagement with (for example, and with reference to FIG. 4B) spring-biased conductive contacts 414 on a sidewall of a recess 412 of a fixture 410 in which test structure 400 is removably received, conductive contacts 414 being in communication with test equipment. Test structure 400 may additionally be biased toward conductive contact 414 by one or more biasing elements 416 on the opposite side of recess 412, or biasing elements 416 may provide the sole lateral bias on a test structure 400 toward conductive contacts 414 if those are not themselves biased. Conductive contacts 414 may, in turn, be hard-wired in the form of conductive traces as shown in broken lines 418 for a connection to test equipment. FIG. 4C depicts an example arrangement of four test structures 400 received in recesses 412 in a fixture 410, and, if a probe card is not employed, connected to test equipment 420 via traces (not shown) carried by fixture 410 operably coupled with conductive contacts 414 (FIG. 4B) in recesses 412.

Figure 5A:
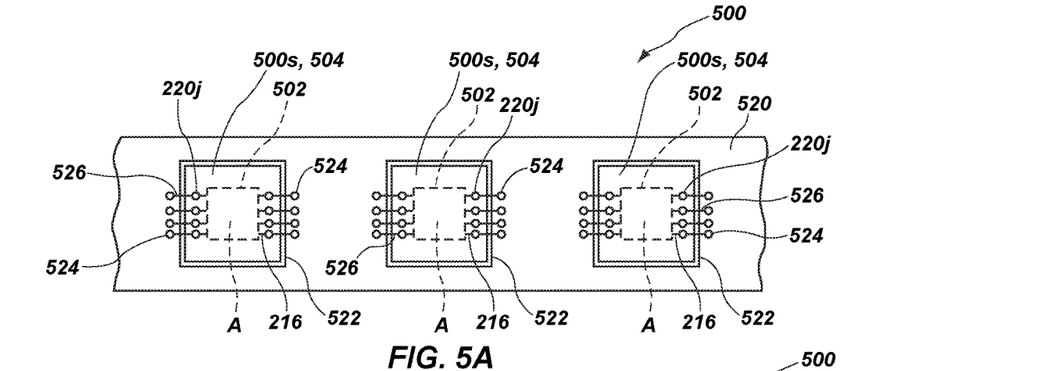
FIG. 5A and FIG. 5B are, respectively, a schematic top elevation and a schematic side, cross-sectional elevation of another embodiment of the disclosure.
Figure 5B:
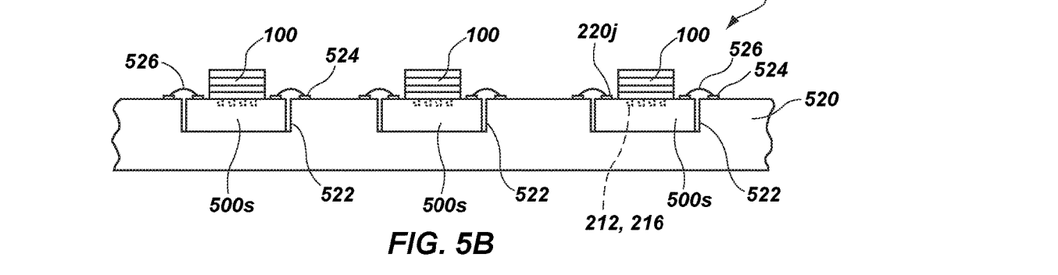

Referring to FIGS. 5A and 5B, another embodiment of a test structure 500 may comprise a holder 520 in which a plurality of recesses 522 may be formed, each recess 522 corresponding to a test site 502. Holder 520 may be strip-like in configuration, rectangular, or of other suitable configuration, and may be formed, for example, of a ceramic, of glass, or of a metal material having a dielectric coating thereon. In test structure 500, each test site 502 comprises a segment 500s of semiconductor material 504 in which an array A, the boundary of which is denoted by broken lines, of pockets 212 bearing conductive contacts 218 (see FIG. 3B) and extending to wirebonding jumper pads 220j through a redistribution layer of conductive traces 216, which has been formed, as described previously in connection with FIGS. 2A through 2D of the drawings. In practice, an array of rows and columns of such segments 500s, of similar but slightly smaller dimensions than the dimensions of recesses 522, may be formed on a wafer or other bulk semiconductor substrate, and severed along streets between adjacent segments 500s. Each such singulated segment 500s may then be deployed, using pick and place equipment, in a recess 522 of a holder 520. Subsequent to population of recesses 522 in a holder 520 with segments 500s, wirebonding jumper pads 220j may be electrically connected with wire bonds 526 to test pads 524 of holder 520 using a conventional wire bonder. Testing of die stacks 100 disposed on each test site 502 may then be conducted using pins 316 of a probe card 310 (see FIG. 3C) to contact test pads 524. Further, testing may be conducted without a probe card if test pads 524 of holder 520 are connected through conductors (not shown) carried by holder 520 to test equipment. In such an instance, a clamp head (see FIG. 6) may be used to maintain die stacks 100 in place and in robust electrical communication with conductive contacts 218. In either case, should a test site 502 of an individual segment 500s fail, such segment 500s may be easily removed, replaced, and wirebonded as convenient. In any of the foregoing implementations of the embodiment, a segment 500s bearing a damaged or otherwise defective test site 502 may be easily removed and replaced.

Figure 5C:
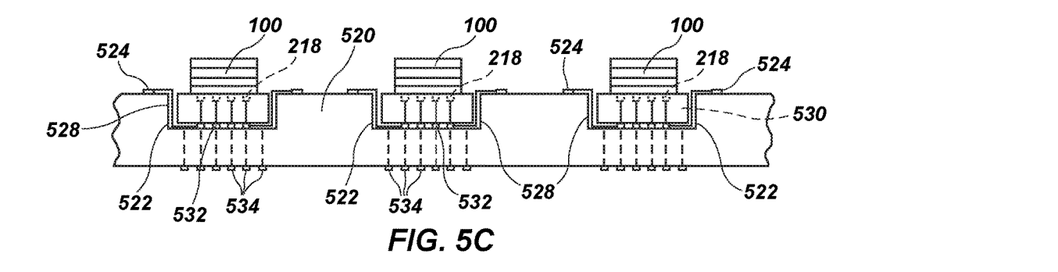
FIG. 5C is a schematic, side sectional elevation of this embodiment depicting additional electrical connection formats.

As a further implementation of this embodiment and as illustrated in FIG. 5C, in lieu of wirebonding jumper pads 220j on test sites 502 of segments 500s to test pads 524 of a holder 520, segments 500s may be configured without conductive traces 216 or test pads 220, and with conductive through vias 530 extending from conductive contacts 218 to the back side of the respective segment 500s, and holder 520 may be configured with a redistribution layer of traces 528 extending from contact pads 532 aligned with the conductive through vias 530 at the bottom of each recess 522 to test pads 524 for probe testing, or to edge connects as depicted in FIG. 4A, or to other connection elements, for example, test lands 534 on an underside of holder 520 for coupling die stacks 100 to test equipment if a probe card is not employed.

Figure 5D:
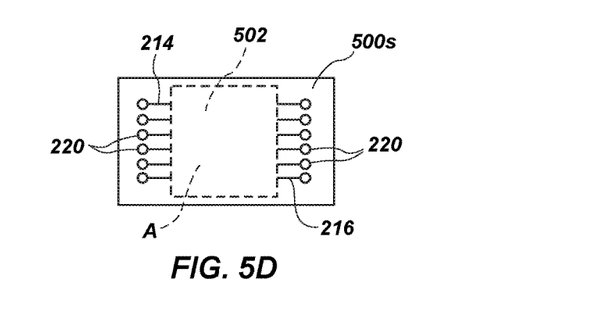
FIG. 5D is a schematic top elevation of this embodiment depicting a further electrical connection format.

As yet another implementation of this embodiment and as illustrated in FIG. 5D, a segment 500s bearing a test site 502 may be electrically self-contained by using conductive contacts 218 (FIG. 3C) connected through conductive traces 216 of a redistribution layer to test pads 220 carried on the segment 500s, test pads 220 being suitably spaced and sized for contact by pins of a probe card. Thus, no electrical connections to a holder 520 bearing segments 500s in recesses 522 are required, and replacement of a segment 500s having a failed test site requires only physical removal and replacement.

Figure 6:
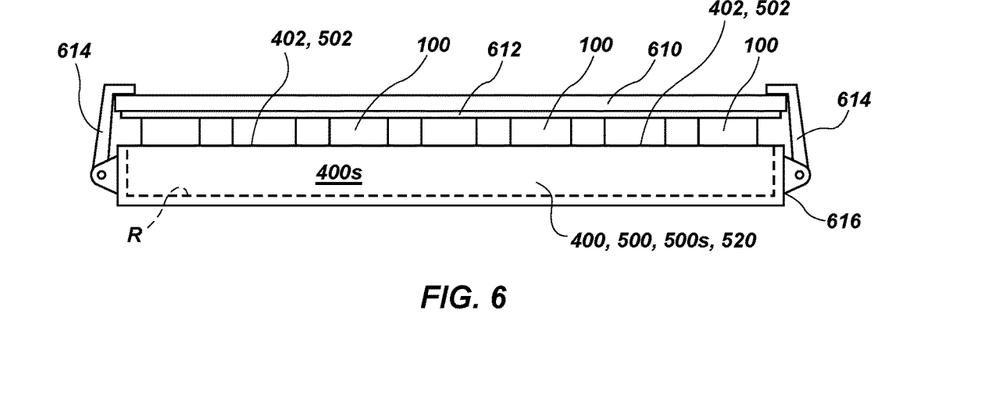
FIG. 6 is a side schematic elevation of yet another embodiment of the disclosure employing a clamp head to maintain a number of cubes on test sites of a test structure.

In the case of either of the foregoing embodiments of test structures 400 and 500, and with regard to FIG. 6 of the drawings, as yet another alternative to loading die stacks 100 on a stationary test structure, a test structure 400 and 500 (the latter including holder 520 and segments 500s) may be configured, for example, as strips having a row of test sites 402 or 502, respectively, to be pre-loaded with a plurality of die stacks 100 each respectively maintained at an associated test site 402, 502 by a clamp head 610 bearing compliant material 612 over each die stack 100 and secured to test structures 400, 500 by pivotable clamp arms 614 or other suitable securement structure. In the case of a test structure 400, the strip of semiconductor material 400s bearing test sites 402 may be placed in a recess R in a carrier 616, as shown in broken lines, to which clamp arms 614 are pivotably secured. The pre-loaded test structure may, using edge connects or other connecting structures known to those of ordinary skill in the art, be removably operably coupled to test equipment. Such an approach may be particularly useful in (while not limited to) conducting, for example, burn-in tests of die stacks 100 wherein placement in an elevated temperature environment, such as at about 190° C. in a burn-in oven, for an extended period of time may be required.

In the case of any of the foregoing embodiments, use of an array of test sites may also enable the use of "gang" type simultaneous picking and placement of multiple die stacks 100 disposed in a receptacle, for example a tray, onto a like number of test sites of a test structure, and gang-type movement of multi-test site test structures. For example and without limitation, a test structure 400 may be loaded with a number of die stacks 100 corresponding to a number of test sites 402 of test structure 400, and test structure loaded with die stacks 100 moved to a fixture 410 for subsequent probe or other testing.

Figure 7:
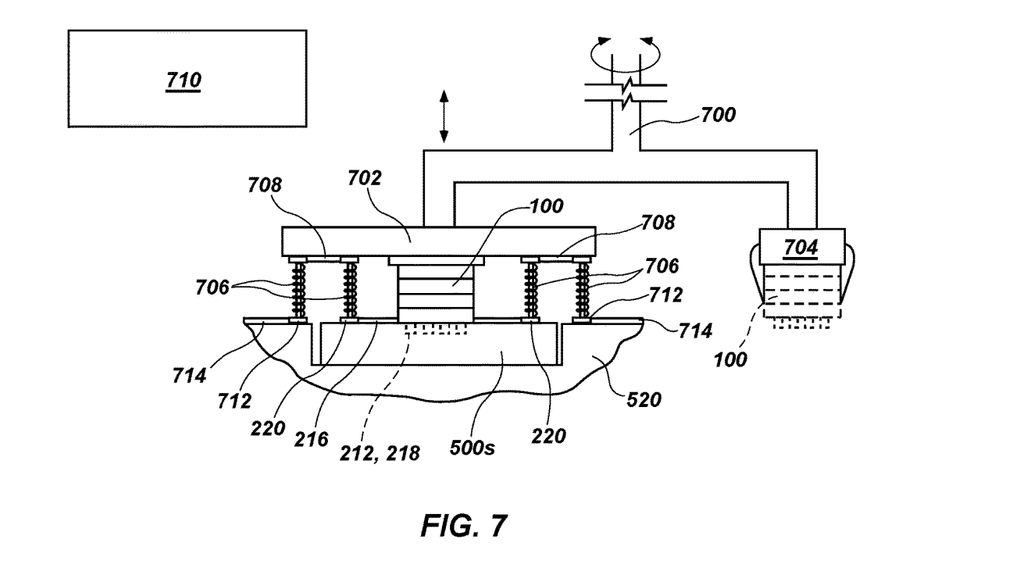
FIG. 7 is a side schematic elevation of a further embodiment of the disclosure, employing a pick and place head in combination with a modified bond head for cube placement and testing.

In yet another embodiment, a segment 500s configured in accordance with FIG. 5D may be employed in combination with pick-and-place equipment 700 comprising a bond head 702 and a pick and place head 704, such apparatus depicted in FIG. 7 with bond head 702 over a segment 500s in holder 520 after placement of a die stack 100 on test site 502 by pick and place head 704. Bond head 702 carries spring-biased contact pins 706 and applies spring-biased contact pins 706 to test pads 220 connected to conductive contacts 218 by conductive traces 216. A second set of spring-biased contact pins 706 operably coupled to the first set of spring-biased contact pins 706 by conductive traces 708 is coupled to test equipment 710 by spring-biased contact with test pads 712 through conductive traces 714. Bond head 702 is used to heat die stack 100 rapidly to a desired temperature approximating a steady state operating temperature, and a test of die stack 100 is conducted by test equipment 710. Die stack 100 may thus be characterized rapidly as a known good cube meeting at least one of a plurality of sets of test parameters for various applications of the die stack 100, or as a defective stack, and transferred to an appropriate location by pick and place head 704 after testing.

A method of testing a semiconductor device comprising a die stack having conductive elements protruding therefrom, wherein the method comprises placing, using a pick and place head, a die stack on a test site of a substrate received by a holder with conductive elements protruding from the die stack at least partially received in an array of pockets of the test site, heating the die stack using a bond head and contacting conductive pads of the test site connected to conductive contacts of the pockets and laterally offset from the die stack with a first set of conductive pins carried by the bond head, and conducting a test of the die stack using test equipment operably coupled to test pads on a surface of the holder in contact with a second set of conductive pins carried by the bond head and connected to the first set of conductive pins.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A semiconductor device test apparatus, comprising:
at least one substrate of a single material, the at least one substrate comprising at least one test site including an array of pockets, each
pocket extending into the single material of the at least one substrate from only one surface thereof to a bottom pocket surface defined by the single material of the at least one substrate and spaced by the single material of the substrate from a surface of the at least one substrate opposite the only one surface, each pocket of the array sized and configured for at least partially receiving a single conductive element protruding from a semiconductor device to be tested on the at least one test site; and a conductive contact within each pocket and located at least proximate the bottom of the pocket coupled to a conductive trace within or directly on the substrate extending to a conductive pad on the substrate and offset from the array of pockets.

2. The semiconductor device test apparatus of claim 1, wherein the conductive traces extend to conductive pads on the only one surface of the at least one substrate into which the pockets of the array extend.

3. The semiconductor device test apparatus of claim 2, further including a fixture having at least one recess therein, the at least one substrate at least partially received in the at least one fixture and the conductive pads being electrically connected to fixture test pads on a surface of the fixture laterally adjacent the surface of the at least one substrate onto which the pockets of the array open.

4. The semiconductor device test apparatus of claim 3, wherein the conductive pads are connected to the fixture test pads with wire bonds.

5. The semiconductor device test apparatus of claim 1, wherein the conductive traces extend to conductive pads on at least one side surface of the at least one substrate.

6. The semiconductor device test apparatus of claim 5, wherein the conductive traces extend through the single material of the substrate to the at least one side surface.

7. The semiconductor device test apparatus of claim 5, further including a fixture having at least one recess therein, the at least one substrate at least partially received in the at least one fixture and the conductive pads being in contact with conductive fixture contacts on at least one wall of the at least one recess.

8. The semiconductor device test apparatus of claim 7, wherein the conductive traces extend to conductive pads on only one side surface of the at least one substrate, the conductive pads being in contact with conductive fixture contacts on only one wall of the at least one recess.

9. The semiconductor device test apparatus of claim 8, further comprising at least one biasing element on a wall of the at least one recess opposite the only one wall of the recess, the at least one biasing element in contact with a side surface of the at least one substrate opposite the only one side surface thereof.

10. The semiconductor device test apparatus of claim 1, wherein the conductive pads are located on a bottom surface of the at least one substrate, the conductive traces are configured as vias extending through the single material of the at least one substrate to the conductive pads, and further including a fixture having at least one recess therein, the at least one substrate received in the at least one fixture and the conductive pads being in contact with conductive fixture contacts on a bottom surface of the at least one recess, the conductive fixture contacts operably coupled to at least one of respective conductive traces extending along the bottom surface of the at least one recess and upwardly over at least one wall of the at least one recess to at least one of test pads on a surface of the fixture adjacent the at least one substrate, or through the fixture to test pads on a bottom surface of the fixture, or through the fixture to test pads on a side surface of the fixture.

11. The semiconductor device test apparatus of claim 2, further comprising:

a probe card for simultaneously contacting conductive pads associated with the at least one test site, the probe card configured, for testing a semiconductor device located on the at least one test site, with a compliant material for contacting an upper surface of the semiconductor device and a number of contact pins arranged for contact with the conductive pads when the compliant material is aligned over the semiconductor device in contact with the upper surface.

12. The semiconductor device test apparatus of claim 2, further comprising a device comprising a bond head and a pick and place head, the bond head having a first set of contact pins arranged for contact with the conductive pads when conductive elements of a semiconductor device aligned with the bond head are received in the array of pockets and a second set of contact pins offset from the first set and operably coupled thereto, contact pins of the second set arranged for contact with test pads on a surface of a holder having at least one recess therein into which the at least one substrate is at least partially received.

13. The semiconductor device test apparatus of claim 12, further comprising test equipment operably couplable to contact pins of the second set.

14. The semiconductor device test apparatus of claim 1, wherein the at least one test site comprises multiple test sites, and the at least one substrate of a single material comprises a single substrate of the single material bearing the multiple test sites, the multiple test sites arranged in one of:

a linear array of test sites; or an array of test sites in multiple rows and columns.

15. The semiconductor device test apparatus of claim 1, wherein the at least one substrate of a single material comprises multiple substrates each of the single material, and the at least one test site comprises multiple test sites, one test site located on each substrate, and further comprising a fixture having recesses therein, at least some recesses each having a substrate at least partially received therein.

16. The semiconductor device test apparatus of claim 1, wherein the at least one substrate of a single material comprises one of a semiconductor material, a glass material or a ceramic material.

17. The semiconductor device test apparatus of claim 1, further comprising a carrier having the at least one substrate at least partially received therein, a clamp head removable coupled to the carrier and extending over the at least one substrate and a compliant material located between the clamp head and the at least one substrate.

18. The semiconductor device test apparatus of claim 17, wherein the at least one substrate comprises a strip of the single material comprising a row of test sites.

* * * * *